(12) United States Patent
Jeong

(10) Patent No.: US 7,570,729 B2
(45) Date of Patent: Aug. 4, 2009

(54) MODE REGISTER SET CIRCUIT

(75) Inventor: Hoe-Kwon Jeong, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 110 days.

(21) Appl. No.: 11/646,428

(22) Filed: Dec. 28, 2006

(65) Prior Publication Data

US 2008/0002804 A1 Jan. 3, 2008

(30) Foreign Application Priority Data

Jun. 29, 2006 (KR) ............... 10-2006-0059069

(51) Int. Cl.
*G11C 19/00* (2006.01)
*H03K 3/356* (2006.01)
*H03K 3/12* (2006.01)

(52) U.S. Cl. ............... 377/64; 327/217; 327/218; 327/321

(58) Field of Classification Search .............. None
See application file for complete search history.

(56) References Cited

U.S. PATENT DOCUMENTS

| 3,812,384 | A | * | 5/1974 | Skorup | 365/154 |
| 5,212,410 | A | * | 5/1993 | Sase | 327/142 |
| 5,502,417 | A | * | 3/1996 | Uriya | 327/541 |
| 6,008,678 | A | * | 12/1999 | Barber | 327/203 |
| 6,178,137 | B1 | * | 1/2001 | Uchihira | 365/233.1 |
| 6,633,504 | B1 | | 10/2003 | Lee et al. | |
| 6,757,214 | B2 | | 6/2004 | Kawaguchi et al. | |
| 7,065,000 | B2 | | 6/2006 | An | |
| 2006/0002225 | A1 | | 1/2006 | An | |

FOREIGN PATENT DOCUMENTS

| JP | 11-203869 A | 7/1999 |
| JP | 2002-133866 A | 5/2002 |
| JP | 2005-116167 A | 4/2005 |
| JP | 2005-302252 A | 10/2005 |
| KR | 10-2005-0025960 | 3/2005 |
| KR | 10-2005-0055861 | 6/2005 |
| KR | 10-2006-0040396 A | 5/2006 |

OTHER PUBLICATIONS

Korean Office Action, with English Translation, issued in corresponding Korean Patent Application No. KR 10-2006-0059069, dated on Jun. 26, 2007.
Korean Office Action issued in corresponding Korean Patent Application No. KR 10-2006-0059069, issued on Dec. 20, 2007.

* cited by examiner

*Primary Examiner*—Tuan Lam
(74) *Attorney, Agent, or Firm*—Mannava & Kang, P.C.

(57) ABSTRACT

A semiconductor memory device includes a mode register set circuit having a changeable default value. The mode register set circuit, the default value of which is changeable, includes a signal input unit for latching an input signal, a storage unit driven by an initializing signal for setting the default value to a logic high or low state as required, and an output unit for latching an output of the storage unit.

15 Claims, 5 Drawing Sheets

US 7,570,729 B2
1

MODE REGISTER SET CIRCUIT

CROSS-REFERENCE TO RELATED APPLICATIONS

The present invention claims priority of Korean patent application number 10-2006-0059069, filed in the Korean Patent Office on Jun. 29, 2006, which is incorporated by reference in its entirety.

BACKGROUND OF THE INVENTION

The present invention relates to a semiconductor memory device; more particularly, to a mode register set (MRS) circuit for setting a burst length and a column address strobe (CAS) latency to control operation modes.

FIG. 1 illustrates a schematic circuit diagram of a conventional MRS circuit with a default value of '0'. The MRS circuit includes a signal input unit 100 for latching an input signal, a storage unit 110 for saving the default value and an output unit 120 for latching an output of the storage unit 110.

When a MRS enabling signal mrs_en, controlling the signal input unit 100, is in a logic low state, a first PMOS transistor P11 and a first NMOS transistor N11 are turned on. Then, an input signal madd is transmitted to a first node a11. The input signal madd is inverted by an inverter I12 and is latched by two inverters I12 and I13. Thereafter, if the MRS enabling signal mrs_en is in a logic high state, a second NMOS transistor N12 and a second PMOS transistor P12 are turned on. The inverted signal at a second node a12 is transmitted to a third node a13. The inverted signal is inverted by an inverter I15 to output as an output signal madd_out1 and latched by inverters I15 and I16. Accordingly, when the MRS enabling signal mrs_en is in a logic low state, the input signal madd is latched. If the MRS enabling signal mrs_en is in a logic high state, the latched input signal is output as the output signal madd_out1.

Considering operation according to the default value stored in the storage unit 110, not according to the input signal, the default value of the MRS circuit described in FIG. 1 will be set at '0'. When an initializing signal pwrup1 is activated in a logic high state, a third PMOS transistor P13 is turned on. A signal on the third node a13 is in a logic high state. The output signal madd-out1 is in a logic low state, i.e., with a value of '0', and is output.

FIG. 2 illustrates a schematic circuit diagram of a conventional MRS circuit with a default value of '1'. The MRS circuit with a default value of '1' includes a signal input unit 200, a storage unit 210 and an output unit 220, substantially the same as the MRS circuit with a default value of '0' does. The signal input unit 200 and the output unit 220 are identical to those described in FIG. 1. Only the storage unit 210 has a different architecture.

Accordingly, operations according to the input signal are performed in the same manner. The MRS circuits operate differently in respect to the default value. In the MRS circuit with a default value of '1', an NMOS transistor N23 is turned on by the activation of the initializing signal pwrup1. The signal on a node a23 is in a logic low state. The output signal madd-out2 becomes a logic high state. The default value of the MRS circuit described in FIG. 2 will be set at '0'.

FIG. 3 illustrates a signal timing diagram of the MSR circuits described in FIGS. 1 and 2. When the initializing signal pwr_up is activated at an initial time ranging from 0 ns to 10 ns, the respective default values are output as the output signals madd_out1 and madd_out2. When the MRS enabling signal mrs_en is activated in a time range of 30 ns to 35 ns,

2 signals at the level of the input signal madd are output as the output signals madd_out1 and madd_out2.

The conventional MRS circuit has a predetermined default value, already set to '0' or '1'. Accordingly, it is impossible to change the default value. An artisan should select one of the different kinds of MRS circuits according to the default value required.

SUMMARY OF THE INVENTION

Embodiments of the present invention are directed to provide a semiconductor memory device having a mode register set circuit with a default value which can be changed.

In accordance with an aspect of the present invention, the mode register set (MRS) circuit with a default value which can be changed, comprises a storage unit, driven by an initializing signal, for setting the default value to a logic high or low state as required.

In accordance with another aspect of the present invention, the MRS circuit with a default value which can be changed, comprises a signal input unit for latching an input signal, a storage unit driven by an initializing signal for setting the default value to a logic high or low state as required, and an output unit for latching an output of the storage unit.

DESCRIPTION OF SPECIFIC EMBODIMENTS

In a conventional MRS circuit, a storage unit outputs a supply voltage in a high logic state when the default value is '0'. The storage unit outputs a ground voltage in a low logic state when the default value is '1'. In accordance with the present invention, it is possible to change the default value as required by selecting a high or low logic value, i.e., the supply or ground voltage, to output from the storage unit in response to an initializing signal.

Hereinafter, a semiconductor memory device in accordance with the present invention will be described in detail referring to the accompanying drawings.

Figure 1:
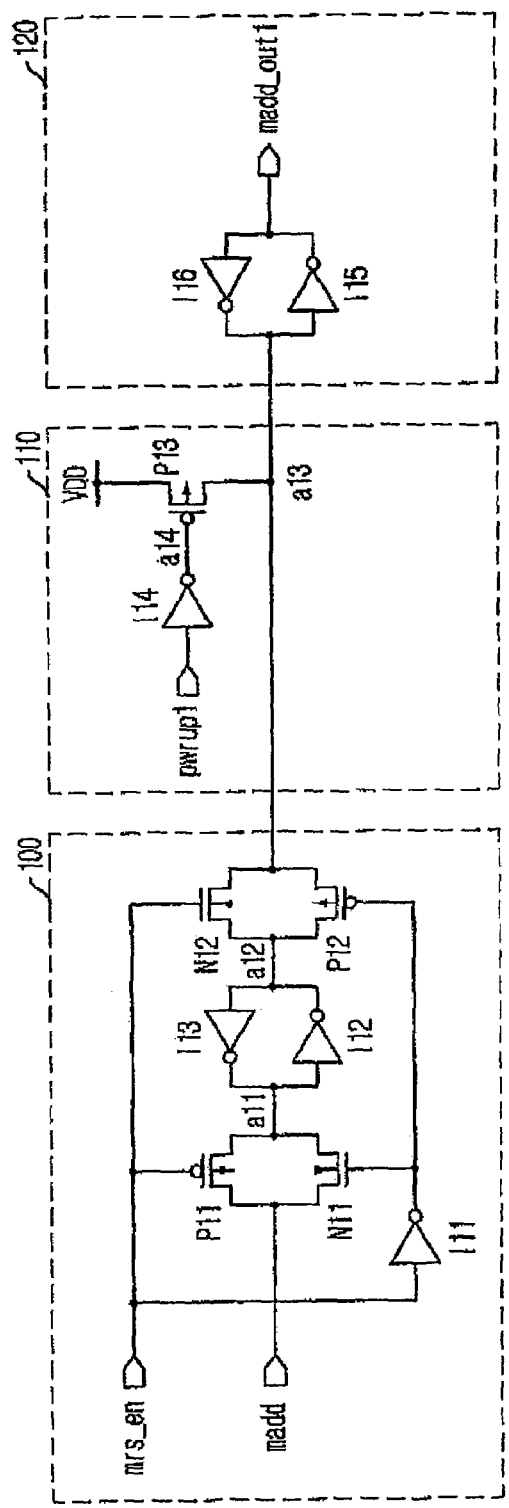
FIG. 1 illustrates a schematic circuit diagram of a conventional MRS circuit with a default value of '0'.
Figure 2:
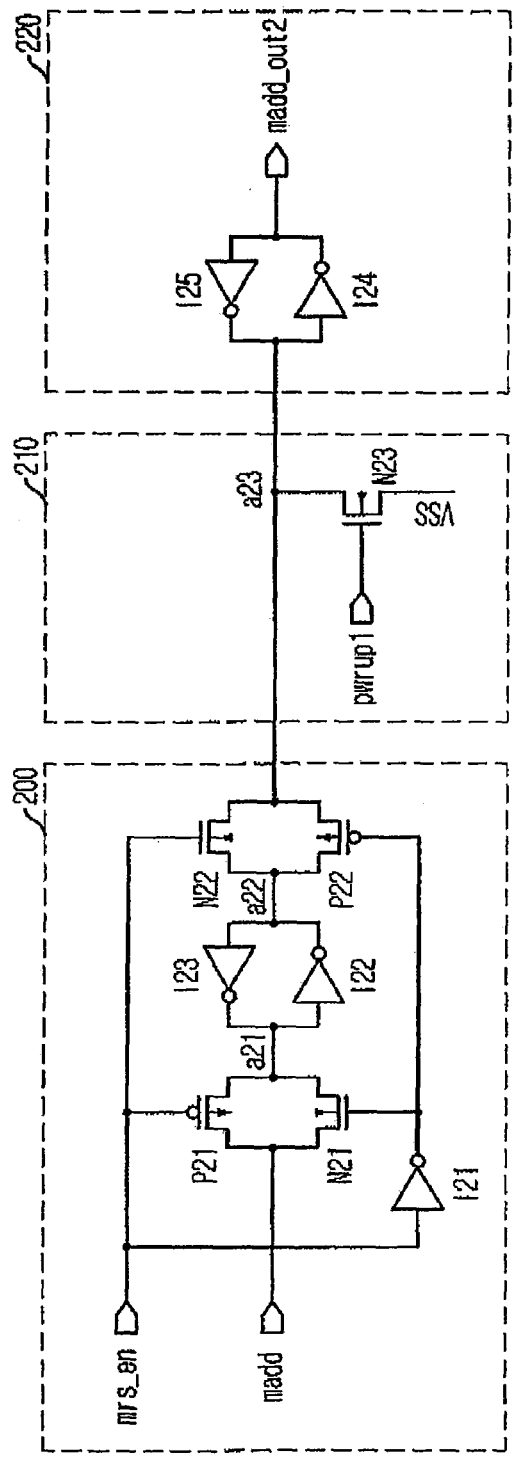
FIG. 2 illustrates a schematic circuit diagram of a conventional MRS circuit with a default value of '1'.
Figure 3:
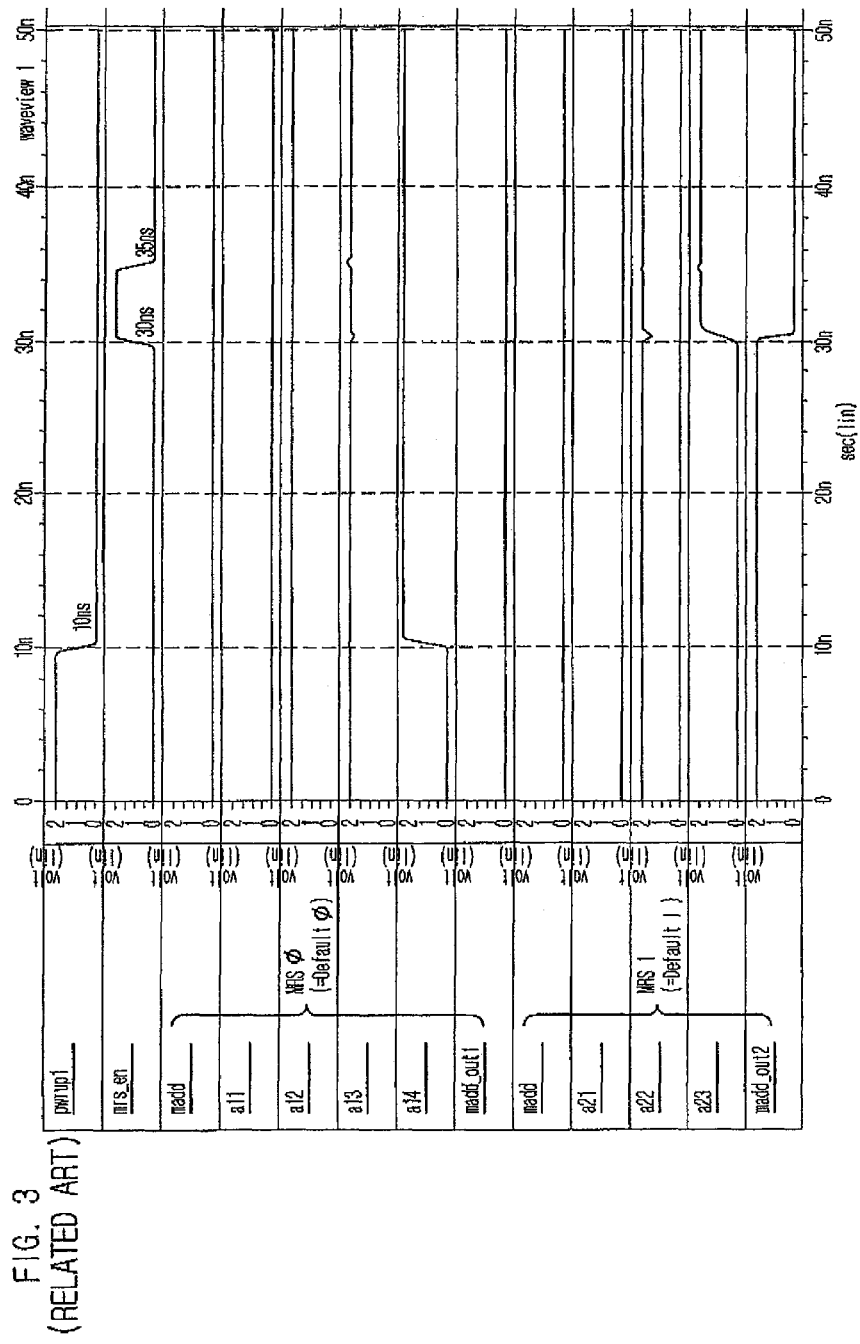
FIG. 3 illustrates a signal timing diagram of the MSR circuits described in FIGS. 1 and 2.
Figure 4:
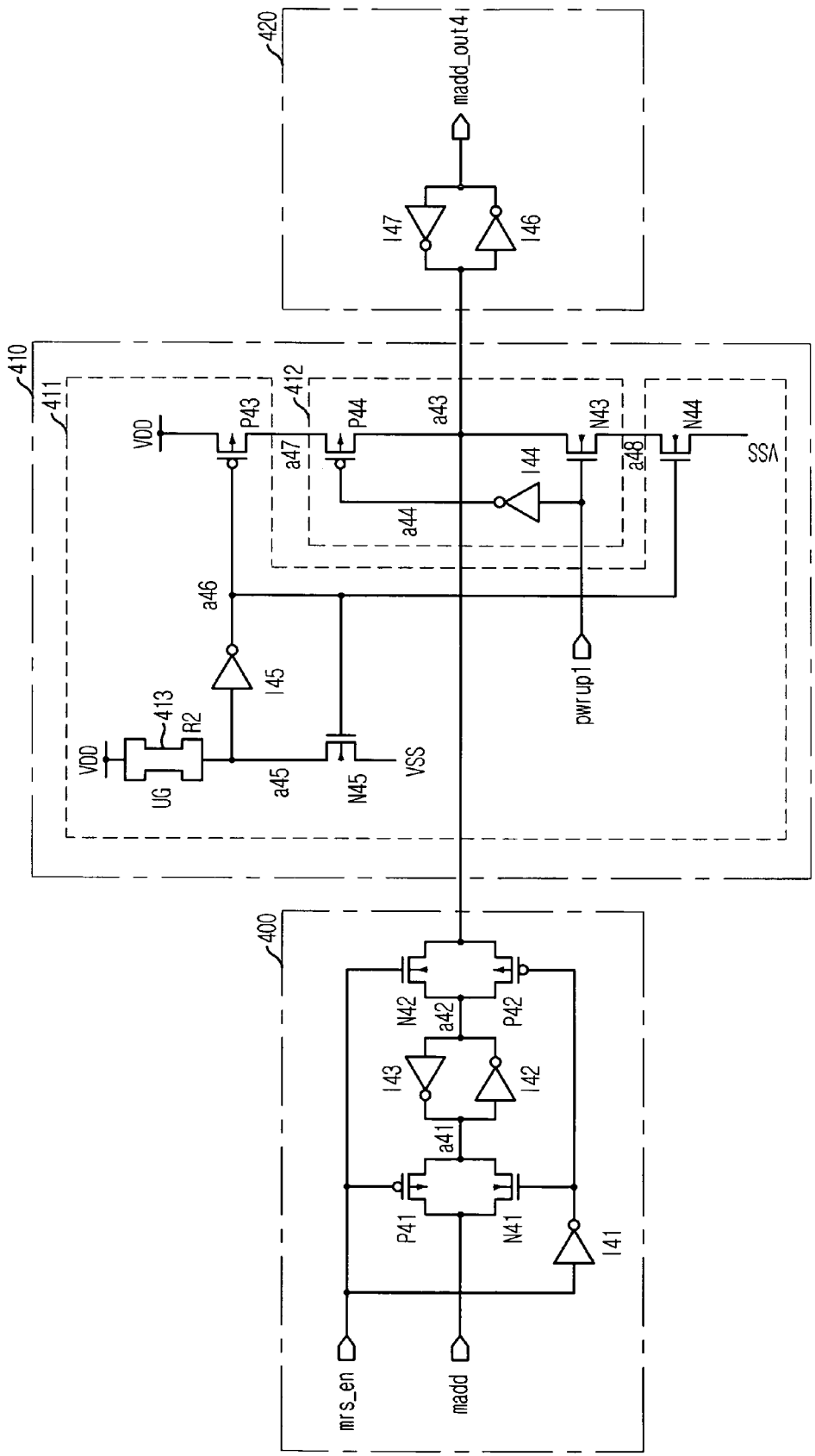
FIG. 4 illustrates a schematic circuit diagram of an MRS circuit in accordance with the present invention.

FIG. 4 illustrates a schematic circuit diagram of an MRS circuit in accordance with the present invention. The MRS circuit having a changeable default value includes a signal input unit 400 for latching an input signal, a storage unit 410 for saving the default value and an output unit 420 for latching an output of the storage unit 410.

The signal input unit 400 includes two PMOS transistors P41 and P42, two NMOS transistors N41 and N42, and three inverters I41 to I43. The first PMOS transistor P41, receiving a MRS enabling signal mrs_en through its gate, transmits an input signal madd through its source-drain channel. The first inverter I41 inverts the MRS enabling signal mrs_en. The first NMOS transistor N41, receiving an output of the first inverter I41 through its gate, is coupled with the first PMOS transistor P41 in parallel. Two inverters I42 and I43 constitute a latch unit which inverts and latches an input signal transmitted by the first PMOS and NMOS transistors P41 and N41. The second NMOS transistor N42, receiving the MRS enabling signal mrs_en through its gate, transmits an output of the latch unit to the storage unit 410 through its source-drain channel. The second PMOS transistor P41, receiving an output of the first inverter I41 through its gate, is coupled with the second NMOS transistor 42 in parallel.

The output unit 420 includes two inverters I46 and I47. The two inverters I46 and I47 constitute a latch unit which inverts and latches an output of the storage unit 410.

The storage unit 410, driven by an initializing signal pwrup1, sets the default value to a logic high or low state as required. The storage unit 410 includes a setting unit 411 and an initializing unit 412. The setting unit 411 selects a logic high or low value according to a fuse connection. The initializing unit 412 outputs the value set by the setting unit 411 in response to the initializing signal pwrup1.

The setting unit 411 includes a fuse 413, an inverter I45, a PMOS transistor P43 and two NMOS transistors N44 and N45. The fuse 413 supplies a supply voltage VDD to a first node a45. The NMOS transistor N45 is connected between the first node a45 and a ground voltage VSS. The inverter I45 inverts a signal on the first node a45 and outputs to gates of the transistors P43, N44 and N45. The PMOS transistor P43 transmits the supply voltage VDD to the initializing unit 412 through a drain-source channel. The NMOS transistor N44 transmits the ground voltage VSS to the initializing unit 412 through a drain-source channel.

If the fuse 413 is connected, the signal on the first node a45 becomes the logic high state represented by the supply voltage VDD. The PMOS transistor P43 is tuned on and the NMOS transistors N44 and N45 are turned off by the inverter I45. A signal on node a47 is in a logic high state represented by the supply voltage VDD. In the case where the fuse 413 is not connected, the signal on the first node a45 is in the logic low state. The PMOS transistor P43 is tuned off and the NMOS transistors N44 and N45 are turned on by the inverter I45. The signal on the node a48 is in a logic low state represented by the ground voltage VSS.

The initializing unit 412 includes an inverter I44, a NMOS transistor N43 and a PMOS transistor P44. The inverter I44 inverts the initializing signal pwrup1. The NMOS transistor N43, connected between a source of the NMOS transistor N44 and an output node a43, receives the initializing signal pwrup1 through its gate. The PMOS transistor P44, connected between a drain of the PMOS transistor P43 and the output node a43, receives an output of the inverter I44 through its gate.

When the initializing signal pwrup1 is activated, the NMOS transistor N43 is turned on, and the PMOS transistor P44 is also turned on by the inverter I44. Accordingly, the output node a43 is connected to the nodes a47 and a48. When the fuse 413 in the setting unit 411 is connected, the signal on the output node a43 is in a logic high state. When the fuse 413 in the setting unit 411 is not connected, the signal on the output node a43 is in a logic low state. The signal on the output node a43 is inverted by an inverter I46 and output as an output signal madd_out4. When the fuse 413 in the setting unit 411 is connected, the MRS circuit has the default value set to '0'. When the fuse 413 in the setting unit 411 is not connected, the MRS circuit has default value set to '1'. Thus, according to the fuse connection, the default value can be changed.

Figure 5:
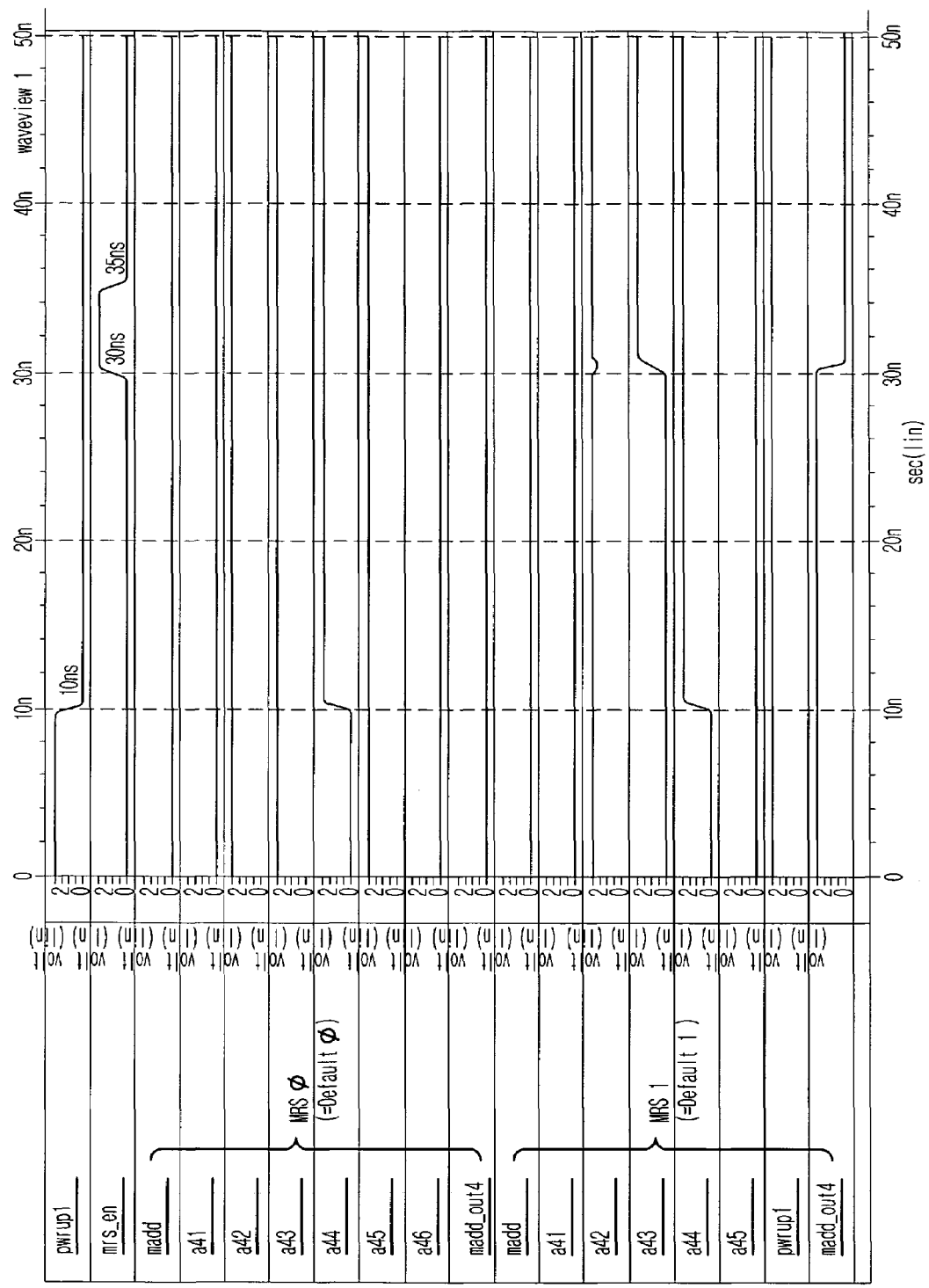
FIG. 5 illustrates a signal timing diagram of the MSR circuit described in FIG. 4.

FIG. 5 illustrates a signal timing diagram of the MSR circuit described in FIG. 4. Before the MRS enabling signal mrs_en is input at 30 ns, the output signal madd_out4 is determined by the default value. When the default value is set to '0', the output signal madd_out4 with a value of '0' is output. When the default value is set to '1', the output signal madd_out4 with a value of '1' is output. After the MRS enabling signal mrs_en is activated at a logic high state, a signal at the level of the input signal madd is output as the output signal madd_out4.

In accordance with the present invention, the default value of the MRS circuit can be changed as required. A required setting value is obtained by changing the default value directly. Accordingly, there is no need to change the input signal in order to obtain the required setting value.

In the above embodiment, the default value is set to '0' or '1' according to a fuse connection. Because the fuse performs a switching function, other devices providing a switching function can be substituted for the fuse. For example, using a logic kit, a logic high or a logic low state can be selected by programming with the logic kit. The present invention can be embodied in a variety of manners.

While the present invention has been described with respect to the particular embodiments, it will be apparent to those skilled in the art that various changes and modifications may be made without departing from the spirit and scope of the invention as defined in the following claims.

What is claimed is:

1. A mode register set circuit having a changeable default value, comprising:
 a signal input unit configured to latch an input signal; and
 a storage unit configured to set the default value to a logic high or low state as required and outputting one of the default value and an output of the signal input unit in response to an initializing signal,
 wherein the storage unit includes:
  a setting unit for configured to select a logic high or low value as required; and
  an initializing unit configured to receive the initializing signal and to output the logic high or low value set by the setting unit in response to the initializing signal.

2. The mode register set circuit of claim 1, wherein the setting unit includes a fuse which is either connected or not as required.

3. The mode register set circuit of claim 2, wherein the storage unit sets the default value to the logic high value when the fuse is connected or to the logic low value when the fuse is not connected.

4. The mode register set circuit of claim 1, wherein the setting unit includes:
 a fuse for connecting a supply voltage to a first node;
 a first NMOS transistor for connecting the first node and a ground voltage through a drain-source channel;
 a first inverter for inverting a signal on the first node;
 a first PMOS transistor for receiving an output of the first inverter through a gate and transmitting the supply voltage to the initializing unit; and
 a second NMOS transistor for receiving the output of the first inverter through a gate and transmitting the ground voltage to the initializing unit.

5. The mode register set circuit of claim 4, wherein the initializing unit transmits a drain voltage of the first PMOS transistor and a source voltage of the second NMOS transistor to an output node when the initializing signal is input.

6. The mode register set circuit of claim 4, wherein the initializing unit includes:
 an input terminal for receiving the initializing signal;
 a third NMOS transistor for receiving an output of the input terminal through a gate and connecting the source of the second NMOS transistor and an output node;

a second inverter for inverting the initializing signal received by the input terminal; and a second PMOS transistor for receiving an output of the second inverter through a gate and connecting the drain of the first PMOS transistor and the output node.

7. A mode register set circuit having a changeable default value, comprising:

a signal input unit configured to latch an input signal;

a storage unit, controlled by an initializing signal, configured to set the default value to a logic high or low state as required;

an output unit configured to latch an output of the storage unit, wherein the storage unit includes:

a setting unit configured to select a logic high or low value as required; and an initializing unit configured to receive the initializing signal and to output the logic high or low value set by the setting unit in response to the initializing signal.

8. The mode register set circuit of claim 7, wherein the setting unit includes a fuse which is either connected or not as required.

9. The mode register set circuit of claim 8, wherein the storage unit sets the default value to the logic high value when the fuse is connected or to the logic low value when the fuse is not connected.

10. The mode register set circuit of claim 7, wherein the setting unit includes:

a fuse for connecting a supply voltage to a first node;

a first NMOS transistor for connecting the first node and a ground voltage through drain-source channel;

a first inverter for inverting a signal on the first node;

a first PMOS transistor for receiving an output of the first inverter through a gate and transmitting the supply voltage to the initializing unit; and a second NMOS transistor for receiving the output of the first inverter through a gate and transmitting the ground voltage to the initializing unit.

11. The mode register set circuit of claim 10, wherein the initializing unit transmits a drain voltage of the first PMOS transistor and a source voltage of the second NMOS transistor to an output node when the initializing signal is input.

12. The mode register set circuit of claim 10, wherein the initializing unit includes:

an input terminal for receiving the initializing signal;

a third NMOS transistor for receiving an output of the input terminal through a gate and connecting the source of the second NMOS transistor and an output node;

a second inverter for inverting the initializing signal received by the input terminal; and a second PMOS transistor for receiving an output of the second inverter through a gate and connecting the drain of the first PMOS transistor and the output node.

13. The mode register set circuit of claim 7, wherein the signal input unit outputs the latched input signal in response to a mode register set enabling signal.

14. The mode register set circuit of claim 7, wherein the signal input unit includes:

a third PMOS transistor for receiving the mode register set enabling signal through a gate and transmitting the input signal through a source-drain channel;

a third inverter for inverting the mode register set enabling signal;

a fourth NMOS transistor, coupled with the third PMOS transistor in parallel, for receiving an output of the third inverter through a gate;

a latch unit, comprising two inverters, for inverting and latching a signal transmitted by the third PMOS and the fourth NMOS transistors;

a fifth NMOS transistor for receiving the mode register set enabling signal through a gate and transmitting an output of the latch unit to the storage unit through a source-drain channel; and a fourth PMOS transistor, coupled with the fifth NMOS transistor in parallel, for receiving the output of the third inverter through a gate.

15. The mode register set circuit of claim 7, wherein the output unit includes two inverters, an input node of each one is connected to the other's output node, for inverting and latching an output of the storage unit.

* * * * *